(12) United States Patent
Pearson et al.

(10) Patent No.: US 8,131,383 B2
(45) Date of Patent: Mar. 6, 2012

(54) METHOD AND SYSTEM FOR RAPID MODELING AND VERIFICATION OF EXCITATION SYSTEMS FOR SYNCHRONOUS GENERATORS

(75) Inventors: William Robert Pearson, Roanoke, VA (US); Pedro Monclova, Salem, VA (US); James William Zeleznik, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/017,262

(22) Filed: Jan. 31, 2011

(65) Prior Publication Data

US 2011/0125449 A1   May 26, 2011

Related U.S. Application Data

(62) Division of application No. 11/381,592, filed on May 4, 2006, now Pat. No. 7,881,814.

(51) Int. Cl.
*G05B 13/02* (2006.01)
*G05B 21/00* (2006.01)
*G06F 17/50* (2006.01)
*F02C 7/26* (2006.01)
*F02C 7/22* (2006.01)

(52) U.S. Cl. .............. 700/29; 700/34; 700/274; 703/13; 703/18; 60/776

(58) Field of Classification Search ...................... 700/29
See application file for complete search history.

(56) References Cited

U.S. PATENT DOCUMENTS

| | | | |
|---|---|---|---|
| 5,483,147 A * | 1/1996 | Ilic et al. .......................... | 322/25 |
| 6,278,898 B1 * | 8/2001 | Shah ............................... | 700/29 |
| 6,839,645 B2 * | 1/2005 | Pearson .......................... | 702/84 |
| 7,016,816 B2 | 3/2006 | Mott | |
| 2002/0052712 A1 | 5/2002 | Voser et al. | |
| 2003/0038216 A1 * | 2/2003 | Holgate .................... | 246/122 R |
| 2005/0137834 A1 | 6/2005 | Heydt et al. | |
| 2007/0239373 A1 | 10/2007 | Nasle | |
| 2007/0245275 A1 | 10/2007 | Jandhyala et al. | |
| 2007/0285079 A1 | 12/2007 | Nasle | |
| 2007/0286089 A1 | 12/2007 | Nasle | |
| 2008/0049013 A1 | 2/2008 | Nasle | |
| 2008/0077368 A1 | 3/2008 | Nasle | |
| 2008/0120080 A1 | 5/2008 | Nasle | |

OTHER PUBLICATIONS

Jin-Cheng Wang et al., "Identification of Excitation System Models Based on On-line Digital Measurements", XP 000558017, Transactions on Power systems, vol. 10, No. 3 Aug. 1995, pp. 1286-1293.
Rodolfo J. Koessler, "Techniques for Tuning Excitation System Parameters", IEEE Transactions on Energy covnersation, vol. 3, No. 4, Dec. 1988, pp. 785-789.

(Continued)

*Primary Examiner* — Albert Decady
*Assistant Examiner* — Sunray Chang
(74) *Attorney, Agent, or Firm* — Nixon & Vanderhye P.C.

(57) ABSTRACT

A system for collecting frequency response data from a generator system including: applying a perturbing signal to a signal input of an exciter system for a synchronous generator; collecting data regarding signal output from a multiplicity of signal points in the exciter system; transforming the collected data to predict a signal response at a signal output in the system different from the signal points used for collecting data, and analyzing the frequency response of the system.

14 Claims, 4 Drawing Sheets

OTHER PUBLICATIONS

Ashok Ramchandran et al., "Frequency-Domain Parameter Estimation for the Brushless Doubly-Fed Machine", 1993, pp. 346-351.

A. Zazo et al., "Identification of Excitation Systems From Time Response Tests", Conference Publication No. 389, IEE 1994, pp. 839-844.

"EX2100 Static Excitation System", GE Industrial Systems, GEI-100488, pp. 1-28, (2000).

"EX2100 Excitation Control", GE Consumer & Industrial, Electrical Distribution, pp. 1-2. (2005).

"EX2100 Excitation System", Efficient Maintenance of EX2100 Excitation System, pp. 1-2. (2005).

"EX2100 Excitation Control", GE Industrial Systems, pp. 1-6. (2001).

X.C. Zhang et al., "User Defined Excitation System Models for Power System Stability Ahnalysis in PSASP", 2005, pp. 1-5.

"Generator Testing and Model Validation", pp. 1-4. (Jun. 2005).

Mohammed A. Abdel-Halim, "Transfer function Model of a Brushless Exciter", J. King Saud Univ., vol. 9, Eng. Sci (2), pp. 221-238 (A.H. 1417/1997).

European Search Report completed Aug. 15, 2007.

Powertech Labs Inc., "Generator Testing and Model Validation", Jun. 2005, 4 pages.

Mohammed A. Abdel-Halim, "Transfer Function Model of a Brushless Exciter", Apr. 1996, pp. 221-238.

Zhang et al., "User Defined Excitation System Models for Power System Stability Analysis in PSASP", 2005, pp. 1-5.

* cited by examiner

METHOD AND SYSTEM FOR RAPID MODELING AND VERIFICATION OF EXCITATION SYSTEMS FOR SYNCHRONOUS GENERATORS

CROSS RELATED APPLICATION

This application is a divisional of application Ser. No. 11/381,592 filed May 4, 2006 which is incorporated herein by reference.

BACKGROUND OF THE INVENTION

This invention relates generally to excitation systems for synchronous generators. In particular, the invention relates to modeling of excitation systems.

Excitation systems are used to produce a dominant magnetic flux in synchronous generators. Synchronous generators typically have a controller for their excitation systems. It is common practice in the industry to produce a tailored IEEE (Institute of Electrical and Electronics Engineers, Inc.) model of the excitation system of a particular industrial generator.

Various generic excitation models have been endorsed by IEEE committees as standard models for use in modeling specific excitation systems. Each of these standard models is a simplified control block diagram with parameters that can be tailored to mathematically match the response of a particular excitation system to certain data inputs. Each model has certain parameters: variables and constants. The constants can be set to tailor the IEEE standard model to simulate the operation of a specific excitation system. The tailored IEEE excitation model is used to simulate the operation of the excitation system for various purposes. One purpose of the model is for use in power system study work, including optimization of the excitation system and its associated generator to improve overall system stability and reliability.

To model a specific excitation system, the appropriate IEEE standard model is selected and is initially tailored based on pre-calculated data obtained for the excitation system. To tailor the IEEE standard model, engineers use pre-calculated data to set parameter values in the selected IEEE standard model. Parameters are first estimated based on known information regarding the exciter. These estimates are determined before the exciter is placed in operation with the generator at a customer site. The selected IEEE standard model is usually further tailored (typically at a remote site away from a customer generator site such as at the site of the manufacturer of the excitation system) using test data obtained on site directly from the exciter and generator.

After the IEEE standard model has been tailored using data obtained from on site testing, additional on site generator testing may be performed to verify the accuracy of the tailored IEEE excitation model. Expert personnel are typically needed at a customer site to perform verification tests of the tailored model. It was not uncommon for extra test and measurement equipment to be brought to site for testing. If a significant discrepancy is detected between the tailored IEEE excitation model and the data obtained from the actual excitation system during on site testing, the tailored IEEE excitation model was updated and reissued. A multi-step analysis performed by experts may have been required to prepare a final IEEE model. The report is generally given to the customer-owner of the generator to document the operational state of the excitation system.

If expert personnel are not on site to verify the tailored IEEE excitation model, less experienced personnel typically perform specific tests and collect data regarding the on site operation of the excitation system. Experts at a remote location may later analyze the collected data to verify the tailored IEEE model. If the collected data was found in error, the testing may have had to been repeated which required an additional visit to the customer site.

In the past, the data recording, analysis, and reporting systems were not fully integrated with the excitation system and its configuration tools. Generation of an accurate and verified IEEE excitation model has often required multiple efforts of selecting a standard model, collecting data from the exciter, tailoring the standard model with the data and verifying the tailored model. This multi-step process has been time consuming, expensive and error prone. There is a long felt need for a more efficient system and method to select an appropriate IEEE standard model, collect test data from the excitation system, tailor the selected standard model, and verify the tailored model.

There is a need in the art to reduce the time and cost of producing an accurate IEEE model of an excitation system. This need includes a better means to identify the characteristics of the excitation system and to predict system performance. There is also a desire to reduce the time needed to test regulator and limiter functions, and it is preferable to conduct on site tests without experts at the site. There is a further need to produce a customer oriented report promptly following site testing.

Further, a validated and tailored IEEE model of an excitation system can be used to optimize the settings of an operational excitation system and generator. Optimization typically involves determining the output responses to the model of a large number of possible input values to the excitation system. The optimization process typically involves many cycles of applying various values of inputs to the model and evaluating the responses of the model. There is a long felt need for a method to optimize the excitation system with fewer cycles of various possible inputs.

BRIEF DESCRIPTION OF THE INVENTION

A method has been developed for modeling an excitation system for a synchronous electrical power generator comprising: selecting a standard IEEE excitation system model from a plurality of standard excitation system models stored electronically; wherein the selected standard model is selected based on a similarity to the excitation system; collecting data from the excitation system; determine parameter settings for the selected standard model using the collected data; verifying the selected standard model with tailored parameters by comparing an output of the model to a corresponding output of the excitation system; storing electronically the verified selected standard model with tailored parameters, and generating a report of the verified selected standard model with tailored parameters.

A method may be also embodied to model an excitation system for a synchronous electrical power generator by the steps of: selecting a standard IEEE excitation system model from a plurality of standard excitation system models stored electronically; wherein the selected standard model is selected based on a similarity to the excitation system; initially determining parameter settings for the selected standard model using pre-calculated data for the excitation system; collecting data from the excitation system during operation of the excitation system; determining substitute parameter settings for the selected standard model using the collected data and an on site maintenance computer; populating the selected standard model with the substitute parameter settings; verifying the selected standard model with the parameter settings by comparing an output of the model to a corresponding output of the excitation system; storing electronically the verified selected standard model with the parameter settings, and generating a report of the verified selected standard model with the parameter settings.

A system has been developed for modeling an excitation system comprising: an excitation controller for a synchronous electrical power generator with data collection capability; a maintenance computer system having stored in data storage a plurality of standard excitation system models and a software tool to tailor the system models; a standard mathematical based IEEE excitation system model stored on the maintenance computer and selected to model the excitation system and selected from a plurality of standard excitation system models stored electronically; data collected from the excitation system and used by the maintenance computer to tailor the selected standard mathematical excitation system model; parameter settings determined by the maintenance computer for the selected standard model using the collected data; a verified selected standard model with the parameter settings stored in the maintenance computer.

A system has also be developed for producing frequency response data from a generator system comprising: applying a perturbing signal to a signal input of an exciter system for a synchronous generator; collecting data regarding signal output from multiple signal points in the exciter system; transforming the collected data to predict a signal response at a signal output in the system different from the signal points used for collecting the data; producing multiple frequency response data using a single test to reduce test time and thus the time a generator is subject to perturbing events; using frequency response measurements for IEEE model validation.

DETAILED DESCRIPTION OF THE INVENTION

Software programs have been developed that may be incorporated in the computer(s) for exciter control hardware and in an attached maintenance computer (e.g. a PC running Microsoft Windows™). The exciter control hardware may be otherwise conventional, such as a General Electric Company EX2100™ exciter, but should for practical reasons be digital in nature for data collection purposes and tuning. The EX2100 exciter performs all control functions, such as regulator and limiter functions, for an excitation system of an industrial or power utility electrical synchronous generator. The attached maintenance computer performs analytical and reporting functions regarding the excitation system. The EX2100 exciter can operate without the maintenance computer being attached and does so during much of the normal operation of the generator. The maintenance computer transmits configuration information to the exciter control and receives data from the exciter control.

Figure 1:
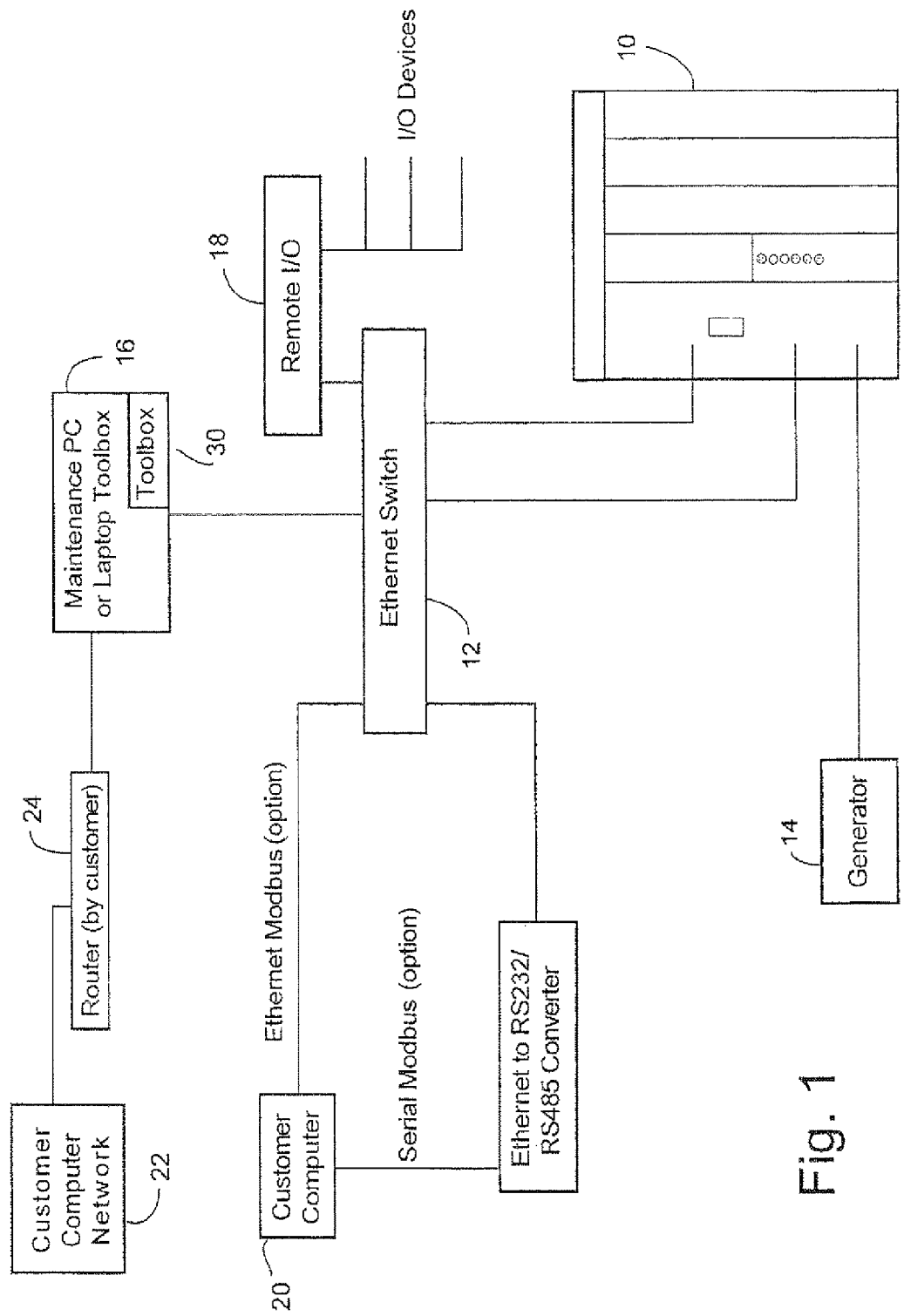
FIG. 1 is a schematic diagram of a network topology for controlling and maintaining an exciter control system for a generator.

FIG. 1 is a diagram of a network topology that includes an exciter control 10, a network switch 12, e.g., an Ethernet switch, and other computers that can access the exciter control. The exciter control 10 powers an exciter for the rotor of a generator 14. A maintenance computer 16, e.g., a personal computer or laptop computer, having analysis, control and optimization software 30 for the exciter may remotely access the exciter through the network and its switch. The maintenance computer may be used to maintain, monitor and optimize the exciter. The maintenance computer 14 may be permanently connected to the exciter control 10 via a network switch 12, or temporarily connected by a field service engineer to monitor the exciter.

The customer operating the generator may have a control and customer user interface computer 20 that accesses the exciter controller to monitor and receive user inputs for the exciter. Further, the maintenance computer 16 may access the customer computer network 22 such as via a router 24 on a computer network associated with the customer site. The exciter control 10 may also be accessible through a remote input/output device(s) 18.

A representative of the manufacturer of the generator or a third-party service provider may for example, operate the maintenance computer 16. The maintenance computer need not be continuously connected to the customer network. By connecting to the customer network 22 the maintenance computer can, for example, submit to the customer reports regarding the performance of the exciter as compared to the tailored IEEE exciter model.

The maintenance computer 16 and the exciter controller 10 communicate locally or remotely over a communications link, such as an Ethernet network 12. The maintenance computer has certain configuration information of the exciter such as gains, time constants, and limit ranges that are needed to control the exciter. The maintenance computer sends commands to the exciter to perform tests that are executed by processors in the exciter.

Figure 2:
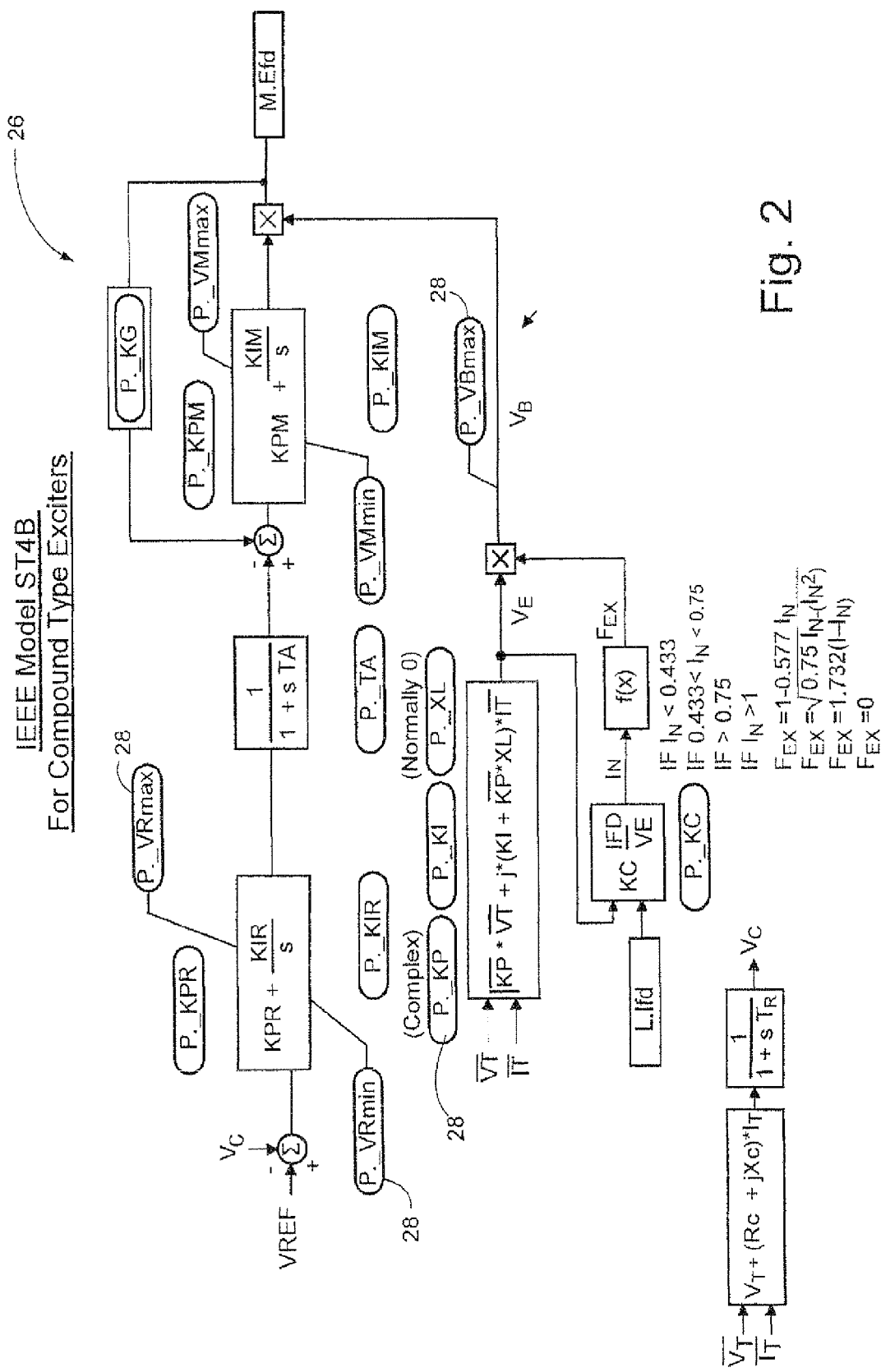
FIG. 2 is a schematic diagram of an exemplary standard IEEE exciter model.

An exemplary standard IEEE exciter model 26 is shown in block diagram form in FIG. 2. IEEE standard models are known by such terms as, for example, ST4B, AC3A, and a proposed model AC7B. The drawings and supporting mathematical functions for each standard model are generic for a type or class of excitation system, and typically are not specific to any particular exciter manufacturer. IEEE standard models are relatively simple and attempt to accurately depict a type or class of exciter controls. An IEEE standard model becomes for practical purposes a mathematical model encoded as a series of algorithms that simulate the operation of the excitation system. The standard model may accept certain predefined parameters 28, such as KPR, KIR, and TA that tailor the standard model to model a particular exciter control system gains and time constants. Variable point names are defined for various input and output points (such as VE and FEX).

The controller configuration software product 30 runs on the maintenance computer 16 and traditionally analyzes data from the exciter controller 10. The exciter controller receives data from the generator 14. An example of conventional software for the maintenance computer is the General Electric Control System Toolbox™ (Toolbox) that is used for configuring the exciter controller.

In the embodiment disclosed herein, the conventional GE Toolbox program has been modified to include electronic drawings and algorithms for standard IEEE models representing the functionality of an excitation system, such as regulators, limiters and protective functions. In addition, the modified Toolbox program 30 includes a module that selects an appropriate IEEE standard model for simulating a particular excitation system and determines values for the parameters in the selected IEEE standard model. As a supplementary possible embodiment, an existing exciter controller software product, e.g., General Electric's EX2100 Analysis Tool, is modified to include software programs to enhance frequency response analyses of the exciter. The exciter control 10 software programs are also modified to support the invention through enhanced data collection features.

The steps and algorithms for selecting an appropriate IEEE standard model and determining its tailored parameters are well known. An IEEE model can be tailored in a manner similar to the process previously done at remote locations. The software module 30 on the maintenance computer allows the model to be tailored on site and without the need for expert assistance. The calculations for determining the parameters are typically established for each of the IEEE standard models. Each IEEE standard model typically includes mathematical algorithms that model the electrical response of the exciter and its controller to various input signals and conditions, rules for determining which exciters correspond to the model and for calculating parameters to the model, and exciter model drawings. The IEEE standard models are included in the modified toolbox program 30 that is stored on the maintenance computer, but may also accessible from a central computer system. The Toolbox Program 30 has the storage means to store the model and assist an engineer populate numerical parameters in the selected model based on exciter data.

The maintenance computer 16 uses the modified toolbox program 30 to calculate the parameters for the selected IEEE standard model based on pre-calculated data and current data collected from the exciter control 10. The parameters for the selected model can be redetermined based on current exciter and generator operating data. By using current data and the modified Toolbox program 30, the tailored IEEE model is always a current representation of the excitation system as installed at a customer site. A mathematical rule set tailors the selected IEEE model and may be developed using ordinary skill of persons who customarily develop exciter models.

Figure 3:
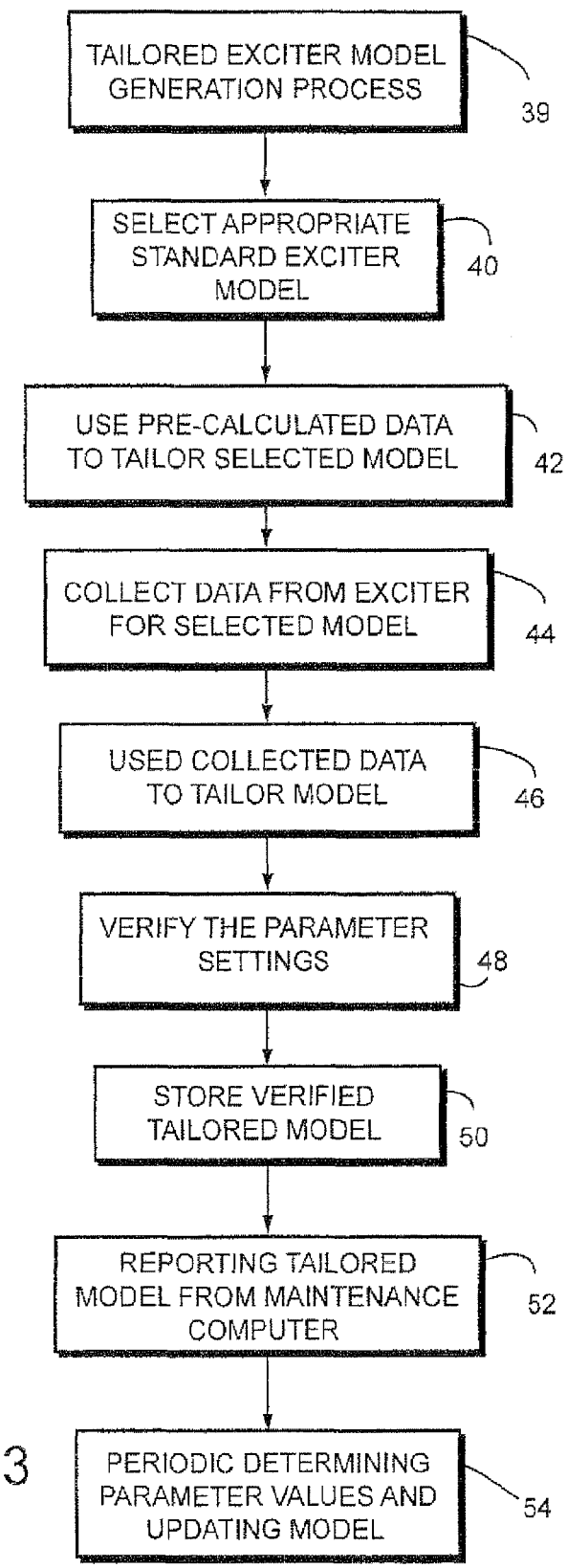
FIG. 3 is a flow chart of an exemplary process for dynamically generating a tailored electronic model of an excitation system and displaying the model.

FIG. 3 is a flow chart of an exemplary process 39 for selecting, determining and using a tailored model of an exciter control system. In step 40, a standard IEEE model is selected from a plurality of standard models. The plurality of standard models may be stored electronically in the memory of the maintenance computer. The stored standard models may be updated from time to time by downloading standard models to the maintenance computer. The selection of the standard model may be done manually by a knowledgeable engineer or technician, or may be selected automatically such as by entering exciter-identifying information that is used by the maintenance computer to select an IEEE standard model appropriate for the identified exciter control. The maintenance computer may include a look-up table that identifies an appropriate standard model for each of a plurality of actual exciter control systems. A manufacturer may, for example, prepare such a look-up table for its various models of exciter control systems.

In step 42, the selected standard model is tailored using pre-calculated data to model an identified exciter. The pre-calculated data may be used to tailor the exciter before the excitation system is operated at the customer site. The pre-calculated is based on initial knowledge of the excitation system. Pre-calculated data may be used for new exciter systems that are not fully operational and have not generated actual performance data.

Once the excitation system is operational at a customer site, the IEEE model tailored with the pre-calculated data may be updated by replacing (step 46) the pre-calculated data with measured data (step 44) collected directly from the excitation system at the customer site. Data collected from the excitation system is stored in the maintenance computer that uses the data to re-calculate and thereby determine all or some of the parameter values for the IEEE model, in step 44. The maintenance computer, which is on site with the generator, tailors the IEEE model and avoids delays associated with remote configuring of the model.

In step 48, the tailored IEEE model is verified by comparing outputs from the model to corresponding actual outputs form the excitation system. The model may be verified on site using the maintenance computer. If any of the outputs of the model differs from the corresponding outputs of the actual excitation system by more than a threshold amount, the maintenance computer can again be used to collect new data regarding the operational conditions of the exciter and re-calculate the parameter values. Generally, the output values from the exciter system such as field voltage and exciter source voltage. These outputs are usually distinct from the exciter data used as inputs values such as field current and generator terminal voltage for determining parameters values for the IEEE model.

When the parameter values have been re-calculated with current test data of the excitation system, the maintenance computer (which is on site with the generator) can immediately update the IEEE model. With the re-calculated parameter values, the maintenance computer may automatically (or with manual assistance of an engineer) verify the model by comparing the model calculated output values with the measured outputs of the actual exciter system. Once the tailored model as been verified, the model can be stored in the exciter controller, in step 50.

The maintenance computer, in step 52, can generate a report that includes a drawing of the model with tailored parameters. These drawings and supplementary information regarding the exciter system may be printed and given the customer. Periodically, the maintenance computer may be used to collect current data from the operational exciter, e.g., real time data collection, and recalculate the parameter values for the tailored IEEE model, in step 54. The updated model may be compared to the prior tailored model to detect trends in the operational state of the exciter circuit. Model variations that appear detrimental may trigger and effort for further evaluation of the system.

As an aid in model construction and calculation of model parameters, a method has been developed that allows the response of the various regulating control loops to be analyzed in a single test. A conventional method of performing a frequency response test at a point in the exciter system is to inject a disturbance signal and measure the output at other point in the system. The conventional approach uses a perturbing source signal and collects only two signals (one input and one output) so as to produce only a single transfer function (known as frequency response or Bode plot) of a single regulator or other function in the overall excitation system during a particular test. The conventional method requires making tests in which a disturbance signal is injected and an output signal is collected at each desired signal input and output location in the system.

The novel method of performing a frequency response test, disclosed herein, allows for the collection of data at two or more output points simultaneously from an exciter system. The method provides a one step process in which one perturbing signal is input to an exciter and multiple signal outputs are collected. The multiple signals allow for the combination of output/input pairs. Each data pair can be used to calculate a transfer function in the frequency domain. The paired data may be a regulator alone or a larger network (i.e. regulator plus generator). Regulators need not be active or in service during the testing. This method benefits the customer by shortening the time that the generator is subject to the perturbing signal.

Following a perturbation test, prior knowledge of the exciter system is used and combined with the knowledge gained by the test. Since many of the regulator transfer functions are known by design (e.g., the block diagrams of the regulator transfer functions are known by design), the transfer function obtained from the test is mathematically divided by the transfer function of the known design to yield only the unknown. The perturbation test analysis method is embodied in software programs that form an integrated system analysis and modeling tool. The software programs may be run from toolbox 30 on the maintenance computer in communication with the generator and exciter.

The software programs allow a user to perform perturbation tests on overall system models to predict system performance, which likely include the generator characteristics. The perturbation test can be used to produce a set of signal transfer functions. These transfer functions can be used to predict overall exciter system performance in response to various signal inputs.

Figure 4:
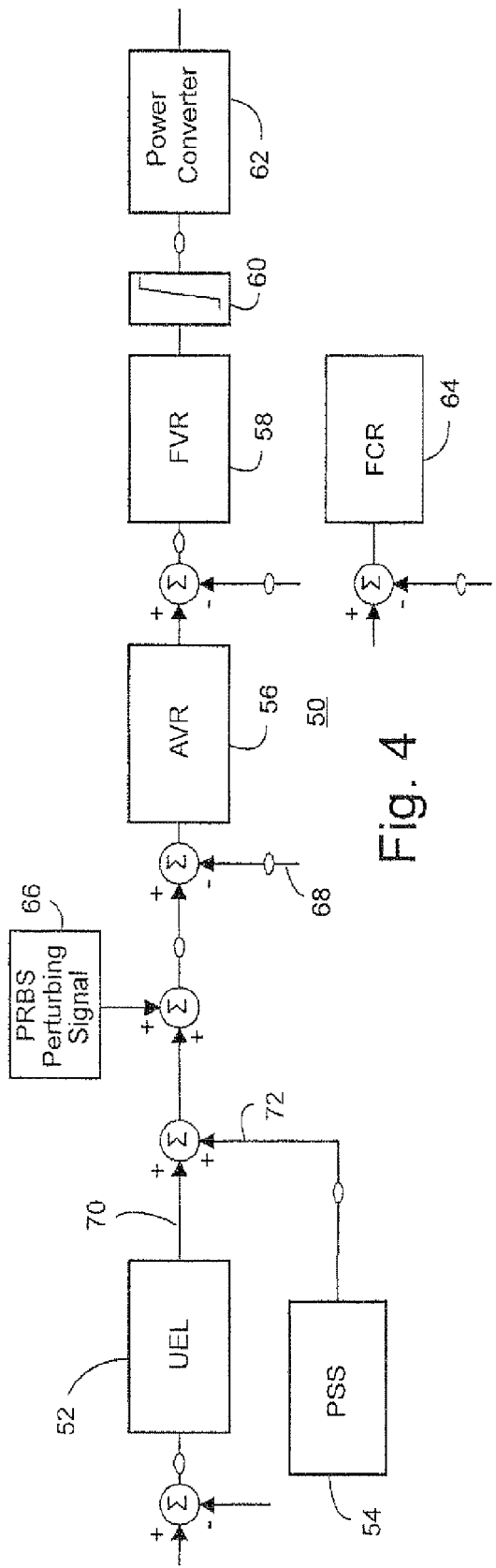
FIGS. 4, 5 and 6 are schematic diagrams of an exemplary excitation system and method for tuning an exciter system.

FIG. 4 is a sample block diagram of an excitation system. This diagram is intended to be a detailed representation specific to an exciter manufacturer. A perturbation input, such as input 66, is used to perform an analysis of the multiple control functions of an exciter controller. The method collects data regarding the response of the exciter to various output/input pairs in a single test. A mathematical model of a static exciter 50 is stored in the maintenance computer and is based on algorithms in the exciter control 10. These algorithms from the exciter control are specific to exciter manufacturer. Using prior knowledge (such as the exciter control 10 algorithms) and measured responses from perturbation test sufficient information becomes available to produce the reduced order models such as the IEEE standard model. For example, parameter KPR in FIG. 2 is partially derives from details within the AVR block 56 in FIG. 4.

The static exciter 50 may include an Under Excitation Limiter (UEL) 52, a Power System Stabilizer (PSS) 54, an Automatic Voltage Regulator (AVR) 56, a Field Voltage Regulator (FVR) 58, a limiter 60, a Power Converter 62 and a Field Current Regulator (FCR) 64. These components are typical of a static exciter system. Each of these components may be mathematically modeled in a software module. The software models of each exciter component may be arranged in the exciter model 50 such that they can simulate the operation of a particular excitation system.

A perturbing signal 66 is applied to the AVR summing junction between the UEL and AVR. The perturbing signal may be generated by a pseudo-random binary sequence (PRBS). The disturbance or perturbing signal 66 is conventionally known to those of ordinary skill with system identification methods as a signal source that is sufficiently stimulating to excite a system, e.g., an exciter, with a broad range of frequencies. A pseudo-random binary sequence may be used as a perturbing signal, and other signals can be used as well. The PRBS signal source generates a perturbing signal that covers a range of 0 Hz to 50 Hz, for example. The component at zero Hz (direct current) is zero so as not to introduce a bias into the regulating loop. The perturbing signal is applied to the exciter model 50 to determine the frequency response of the exciter.

Additionally, a step-type perturbing signal may be applied to determine the response of the exciter to a step signal. The PRBS may be replaced by a step-type perturbing signal that would be applied to various input points on the exciter model.

Unlike the single perturbing signal applied for a frequency response analysis, step signals are applied to various input points of the static exciter. A separate test is performed for each location of the exciter to which a step signal is applied. In contrast, a single test is performed to analyze the frequency response of the exciter using a perturbing signal applied to one point, e.g., AVR summing junction, on the exciter model.

The perturbing signal 66 is applied to the input of the AVR. Other signals that sum into the input of the AVR include the AVR feedback signal 68 and the UEL output 70 and the PSS output 72. During the application of the perturbing signal, the feedback signal 68, UEL output 70 and PSS output 72 are all affected. When the perturbing signal is applied, the entire system 50 is perturbed and data is collected on output signal lines 68, 70, 72 for the AVR feedback and the UEL and PSS output. Other signal points in the system may also provide output signals that are collected while the perturbating signal is applied to the AVR input. The collected signals are representative of the entire system response to the perturbing signals. The system response to a wide range of signals can be determined by applying to the AVR input the pseudo-noise perturbing signal 66 over a wide range of frequencies, and collecting the system response from the signal lines typically used for the AVR feedback 68, the UEL or PSS outputs, and optionally at other signal points in the exciter system.

Figure 5:
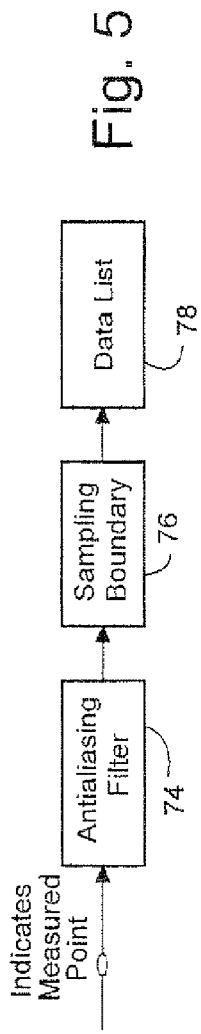

As shown in FIG. 5, the collected output signals 68, 70 and/or 72 may be filtered by, for example, an antialiasing filter 74. The collected signals may also be sampled 76 at a predetermined rate, which is slower than the data rates from the output signals 68, 70 or 72. The sampling step 76 may be used to reduce the amount of data collected and stored 78 in a database having a listing of the collected data.

Figure 6:
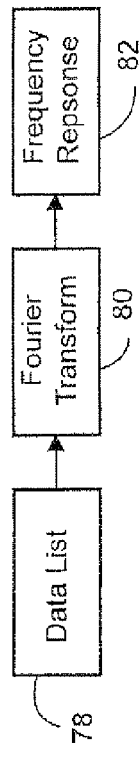

As shown in FIG. 6, the stored data 78 may be analyzed to produce the frequency response to the system 50. For example, the stored data may be transformed from a time domain to a frequency domain using a Fourier transform 80 that generates the frequency response 82 of the system in terms of amplitude and phase verses frequency.

The various signal paths through the excitation system are interconnected through direct connections within the exciter components of the exciter system 50 shown in FIG. 4 or through connections that pass through the generator itself. The perturbing signal 66 produces activity at all or many of the signal points in the system 50. The system points may be at most or all of the inputs and outputs to the components of system 50 shown in block form in FIG. 4. The signal responses at the AVR feedback point 68, the UEL output 70, along with outputs of components, 52, 54, 56, 58, 60, 62 and 64 may also be stored in the data list. Any two signals from the data list may be paired (one deemed an input and the other an output) for Fourier analysis as shown in FIG. 6. In other words, the system frequency response at any system point to any other system point can be analyzed using the data in the data list 78. An exciter system can be optimized by analyzing the frequency response at certain signal outputs to selected signal inputs and determining appropriate exciter control settings to achieve desired signal outputs.

The fully integrated modeling and analysis system disclosed herein provides support for excitation control, configuration, system stimulation, data collection, data analysis, IEEE modeling, exciter system identification and customer reporting systems. The system has the ability to perform a complete analysis of the regulating loops in a single test. It is anticipated that power generation customers will subscribe to a service that provides periodic model validation and verification. Periodic IEEE model verification may in the future be required of United States power producers by the National Electric Reliability Council (NERC) as follows: (i) written validation on annual basis, and (ii) test report required detailing IEEE model validation every 5 years. It is expected that power generation customers will save significant cost in the verification and validation of their generator/exciter model through the modeling and analysis system disclosed herein.

The modeling and analysis system offers flexibility in scheduling model verification and validation. In addition, except for a maintenance computer, no external test equipment is required, thus providing for customers the highest confidence that performance of model verification and validation will not inadvertently cause a unit trip. The system has the ability to perform a complete analysis of the regulating loops in an exciter system in a single test by application of one perturbating signal. It is anticipated that power generation customers will subscribe to a service that provides periodic model validation and verification.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for collecting and analyzing frequency response data from a synchronous generator comprising:
    perturbing a signal applied to a signal input of an exciter system of the synchronous generator;
    collecting signal response data generated by the synchronous generator in response to the perturbed signal, where the signal response data is collected from a plurality of signal points in the exciter system;
    deriving a transfer function using the signal response data wherein the transfer function generates a predicted signal response at a signal output point for the synchronous generator system and the signal output point is different from the signal output points from which the data is collected;
    applying an input signal to the transfer function to generate the predicted signal output corresponding to the signal output point, and
    applying the predicted signal output to model an operation of the synchronous generator.

2. The method as in claim 1 wherein the perturbing signal is a pseudo random binary sequence.

3. The method as in claim 1 wherein the perturbing signal covers a range of 0 Hz to 50 Hz, wherein the perturbing signal is zero when at zero Hz.

4. The method as in claim 1 wherein the data collection is performed during application of the perturbing signal to a single input of the exciter system.

5. The method as in claim 1 wherein the data is collected from a multiplicity of pairs of the signal points in the exciter system.

6. The method as in claim 1 further comprising sampling the data being collected.

7. The method as in claim 1 wherein the signal response data is collected at the same time from the plurality of signal points.

8. A method to predict a response to an input signal by a synchronous generator comprising:
    a perturbing an input signal applied to a signal input of an exciter system for the synchronous generator;
    collecting signal response data generated by the exciter system in response to the perturbation of the input signal, wherein the signal response is collected from a plurality of signal output points in the exciter system;
    determining a transfer function based on the collected signal response data, wherein the transfer function generates a predicted signal output at a selected signal output point for the synchronous generator system and the selected signal output point is different from the plurality of signal input points from which the data is collected;
    generating a signal output corresponding to the selected signal output point using the transfer function and a known input signal to be applied to the transfer function, and
    applying the signal output as a predicted response of the exciter system to model an operation of the synchronous generator.

9. The method as in claim 8 wherein the perturbing signal is a pseudo random binary sequence.

10. The method as in claim 8 wherein the perturbing signal is at various frequencies in a range of 0 Hz to 50 Hz.

11. The method as in claim 8 wherein the data collection is performed during application of the perturbing signal to a single input of the exciter system.

12. The method as in claim 8 wherein the data is collected from a multiplicity of pairs of the signal points in the exciter system.

13. The method as in claim 8 further comprising repeatedly sampling the data in the step of collecting the signal response data.

14. The method as in claim 8 wherein the signal response data is collected simultaneously from the plurality of signal points.

* * * * *

UNITED STATES PATENT AND TRADEMARK OFFICE
CERTIFICATE OF CORRECTION

| | |
|---|---|
| PATENT NO. | : 8,131,383 B2 |
| APPLICATION NO. | : 13/017262 |
| DATED | : March 6, 2012 |
| INVENTOR(S) | : William Pearson et al. |

It is certified that error appears in the above-identified patent and that said Letters Patent is hereby corrected as shown below:

At column 6 line 12, delete "form the excitation system" and insert --from the excitation system--

In the Claims:

In Claim 1 at column 9, line 37, delete "of signal points" and insert --of signal output points--

In Claim 8 at column 10, line 15, delete "a perturbing" and insert --perturbing--

Signed and Sealed this
Third Day of July, 2012

David J. Kappos
*Director of the United States Patent and Trademark Office*